US 8,085,133 B2

United States Patent
Hill

(10) Patent No.: US 8,085,133 B2
(45) Date of Patent: Dec. 27, 2011

(54) RFID INTERROGATOR

(75) Inventor: Nicholas Patrick Roland Hill, Cambridge (GB)

(73) Assignee: Cambridge Resonant Technologies Ltd., Cambridge (GB)

( * ) Notice: Subject to any disclaimer, the term of this patent is extended or adjusted under 35 U.S.C. 154(b) by 852 days.

(21) Appl. No.: 12/119,263

(22) Filed: May 12, 2008

(65) Prior Publication Data

US 2009/0009292 A1    Jan. 8, 2009

(30) Foreign Application Priority Data

May 18, 2007   (GB) .................................. 0709575.5

(51) Int. Cl.
*H04Q 5/22* (2006.01)
(52) U.S. Cl. .................. 340/10.4; 340/10.1; 331/117 R
(58) Field of Classification Search .............. 340/10.1, 340/10.4, 572.5; 455/73; 363/17, 132, 20, 363/98; 327/553, 596, 100, 190; 331/74, 331/117 R, 166
See application file for complete search history.

(56) References Cited

U.S. PATENT DOCUMENTS

| | | | |
|---|---|---|---|
| 4,497,133 A | 2/1985 | Blenkinsop | |
| 4,924,171 A | 5/1990 | Baba et al. | |
| 5,283,529 A * | 2/1994 | Meier | 327/596 |
| 5,374,930 A * | 12/1994 | Schuermann | 342/42 |
| 5,488,272 A * | 1/1996 | Cotton | 315/408 |
| 5,491,715 A | 2/1996 | Flaxl | |
| 5,550,548 A | 8/1996 | Scheurmann | |
| 5,952,935 A | 9/1999 | Mejia | |
| 5,992,096 A | 11/1999 | De La Cerda et al. | |
| 6,044,795 A | 4/2000 | Matsuura | |
| 6,297,739 B1 | 10/2001 | Small | |
| 6,396,716 B1 * | 5/2002 | Liu et al. | 363/17 |
| 6,650,226 B1 | 11/2003 | Wuidart | |
| 6,650,227 B1 | 11/2003 | Bradin | |
| 6,806,783 B2 * | 10/2004 | Baumann et al. | 331/74 |
| 6,930,893 B2 * | 8/2005 | Vinciarelli | 363/17 |
| 6,944,990 B2 | 9/2005 | Noyes | |
| 7,145,451 B2 * | 12/2006 | Ward, Jr. | 340/506 |
| 7,145,786 B2 * | 12/2006 | Vinciarelli | 363/17 |

(Continued)

FOREIGN PATENT DOCUMENTS

DE    4124143    1/1993

(Continued)

OTHER PUBLICATIONS

European Search Report & Written Opinion from co-pending Application EP10187234, completion date Jan. 26, 2011.

(Continued)

*Primary Examiner* — Benjamin C Lee
*Assistant Examiner* — Peter Mehravari
(74) *Attorney, Agent, or Firm* — Wolf, Greenfield & Sacks, P.C.

(57) ABSTRACT

Embodiments of the invention relate to the field of RFID interrogators, particularly RFID interrogators that combine low loss with high rates of communication from the interrogator to a tag. We describe a transmitter comprising a resonant circuit and a driver coupled to drive said resonant circuit, wherein said resonant circuit includes a resonance regeneration system such that during amplitude modulation of a resonant signal in said resonant circuit when an amplitude of said resonant signal is reduced energy from said reduction is stored and when said amplitude is increased said stored energy is used to regenerate said resonance signal.

12 Claims, 8 Drawing Sheets

U.S. PATENT DOCUMENTS

| | | | |
|---|---|---|---|
| 7,561,446 B1 * | 7/2009 | Vinciarelli | 363/17 |
| 7,642,728 B2 * | 1/2010 | Moisin | 315/291 |
| 2002/0011217 A1 | 1/2002 | Brooks | |
| 2003/0006880 A1 | 1/2003 | Zimmer | |
| 2004/0100386 A1 | 5/2004 | Blount | |
| 2005/0041441 A1 * | 2/2005 | Nagai et al. | 363/21.06 |
| 2005/0134435 A1 | 6/2005 | Koyama | |
| 2009/0130988 A1 * | 5/2009 | Goldberg | 455/73 |

FOREIGN PATENT DOCUMENTS

| | | |
|---|---|---|
| EP | 0400764 A2 | 12/1990 |
| EP | 0525642 A2 | 2/1993 |
| EP | 0568398 A2 | 11/1993 |
| EP | 0663724 A2 | 7/1995 |
| EP | 1589656 A1 | 10/2005 |
| GB | 2321726 A | 8/1998 |
| GB | 2376977 | 12/2002 |
| GB | 2381180 A | 4/2003 |
| GB | 2393245 A | 3/2004 |
| GB | 2419777 A | 5/2006 |
| GB | 2430331 | 10/2007 |
| GB | 2431431 | 5/2010 |
| JP | 4031580 | 2/1992 |
| WO | WO 95/35609 A1 | 12/1995 |
| WO | WO 98/01837 A1 | 1/1998 |
| WO | WO 99/60696 A1 | 11/1999 |
| WO | WO 00/11592 A2 | 3/2000 |
| WO | WO 02/50782 A2 | 6/2002 |
| WO | WO 2005/104022 A1 | 11/2005 |
| WO | WO 2007/068974 A | 6/2007 |
| WO | WO 2007/068975 A | 6/2007 |
| WO | WO 2008/041016 A1 | 4/2008 |
| WO | WO 2008/110833 A1 | 9/2008 |
| WO | WO 2008/115315 A2 | 9/2008 |

OTHER PUBLICATIONS

European Search Report & Written Opinion from co-pending Application EP10187234, completion date Jan. 21, 2011.

* cited by examiner

RFID INTERROGATOR

FIELD OF INVENTION

Embodiments of the invention relate to the field of RFID interrogators, particularly RFID interrogators that combine low loss with high rates of communication from the interrogator to a tag.

BACKGROUND TO THE INVENTION

In an RFID system resonant circuits are generally used in both the reader and the transponder. Their use increases the efficiency of energy transfer between the two circuits, which would otherwise be much lower, severely limiting the range of operation. Optimal read range may be achieved when the reader is stimulated at its resonance frequency, and this also matches the resonant frequency of the transponder.

The inventor's earlier patent applications PCT/GB2006/050436 and PCT/GB2006/050440 outline methods that allow the use of a high Q antenna in an RFID reader. These methods prevent the conventional problems of a high Q resonant system associated with a narrow bandwidth. Firstly, a resonator is described that naturally tunes to the stimulus frequency over a wide bandwidth, independent of the level of loss. Secondly, a feedback method is described that increases the speed of response of the reader to load modulation in the tag, whilst maintaining the low loss for slowly varying signals.

An RFID interrogator provides for both tag to reader communication and also reader to tag communication. The prior art provides an improved efficiency method for tag to reader communications through the use of a high Q antenna. However, for reader to tag communications modulations of the reader energising field are required. A high Q resonator may not provide sufficient speed of response to allow amplitude modulations at the required rate simply through turn off and turn on of the stimulus. Obvious extensions to this are the use of a damping circuit to attenuate the reader field quickly at turn off, and drawing increased current from the power supply to accelerate the subsequent turn on.

The drawback of these prior art methods are that the turn on/off time may still be limited, and also they involve the dissipation of the resonance energy at each modulation. When data is passed from the reader to the tag, for example in programming or password exchange, the benefits of the high Q reader antenna will not be realised.

There is therefore the requirement for an RFID interrogator capable of both efficient tag to reader communication and also efficient reader to tag communication.

SUMMARY OF THE INVENTION

The invention is set forth in the independent claims.

In embodiments the field generated by an RFID interrogator may be modulated at a high rate without the energy loss associated with dissipation of the resonance energy at each modulation cycle.

In embodiments the oscillation of the resonator is stopped suddenly and the resonance energy stored in the form of charge. Transients may be generated when the resonator is stopped and these may be controlled with a separate block to dissipate such unwanted currents.

The energy stored when the resonator is stopped may be recycled when the resonator is turned back on. The resonator may therefore be re-started in a high amplitude, without the usual time constant associated with ramp up of a resonant system from a low energy state. The resonator may be a nonlinear resonator incorporating a MOSFET that is switched over on/off over a full cycle in response to the amplitude of a waveform in the resonator. Such a resonator has the beneficial property that it is able to adapt to the driving frequency over a given bandwidth, independent of the level of loss in the circuit. This allows a high Q resonator to be used in the RFID interrogator without a fine tuning circuit.

Alternatively the resonator may be a conventional linear resonator and may include a tuning circuit.

The RFID interrogator may incorporate feedback to reduce transient changes in the amplitude of the resonator. Implementation of feedback may improve the speed of response of the interrogator when used as a reader. Also the feedback may reduce transients in the amplitude of the resonator when it is restarted over the course of the modulation of the interrogator field. Alternatively the RFID interrogator may not implement feedback.

The interrogator may measure the behaviour in normal oscillation to determine the timing of the stimulus pulses relative to the resonance current. It may then use this to calculate a turn on time that will result in a more smooth turn on waveform. Alternatively the interrogator may turn on with a default timing and the feedback may reduce the transient changes in the resonator amplitude.

Modulation for the interrogator field may be used for reader to tag communications, including tag programming and password exchange for encryption.

The modulation may be used for half duplex reading in addition to full duplex reading.

The methods outlined in this patent, although focussed on RFID interrogation, may generally applied to amplitude modulation. These methods allow high-speed communication with high efficiency and improve on conventional methods that may dissipate the energy in the modulating signal. They may be applied to any application where decreased turn off or turn on times of an oscillatory signal are required.

The methods may be applied over a wide frequency band ranging from sub-sonic to microwave frequencies and beyond. More specifically to RFID, all common RFID frequency bands are included, such as 125 kHz, 134 kHz, 13.56 MHz, 869 MHz, 915 MHz, etc.

Broadly we will describe the following areas

1. A resonator that is made to undergo amplitude modulation such that when it is turned off the energy is stored as potential energy in the resonator capacitors, and is subsequently reused when turned back on again.
2. A circuit incorporating the resonator of point 1, and also including a block to reduce the amplitude of turn off transients.
3. A circuit incorporating the resonator of point 1 or 2 that also uses feedback to minimise the transient changes to the amplitude of the resonator, which may be used to speed up the response of resonator to load modulation in a tag.
4. A circuit according to any of the above points that also uses feedback to minimise the transient changes to the amplitude of the resonator, which may be used reduce the amplitude and/or duration of turn on transients.
5. A circuit according to any of the above points that makes use of a nonlinear adaptive resonator.
6. A circuit according to any of the above points that makes use of a high Q antenna with a Q preferably greater than 20 and more preferably greater than 50.
7. An RFID interrogator based on any of the above points.
8. A communication system based on any of the above points.
9. A wireless energy transfer system based on any of the above points.

10. An system that measures the timing of the stimulus pulses relative to the antenna current in normal operation and then uses this to calculate the timing for turn on. This may be used to improve the smoothness of the turn on waveform.

BRIEF DESCRIPTION OF THE DRAWINGS

FIG. 8 shows waveforms of the circuit in FIG. 5 where the resonator is both stopped and re-started.

DETAILED DESCRIPTION OF EMBODIMENTS

Figure 1:
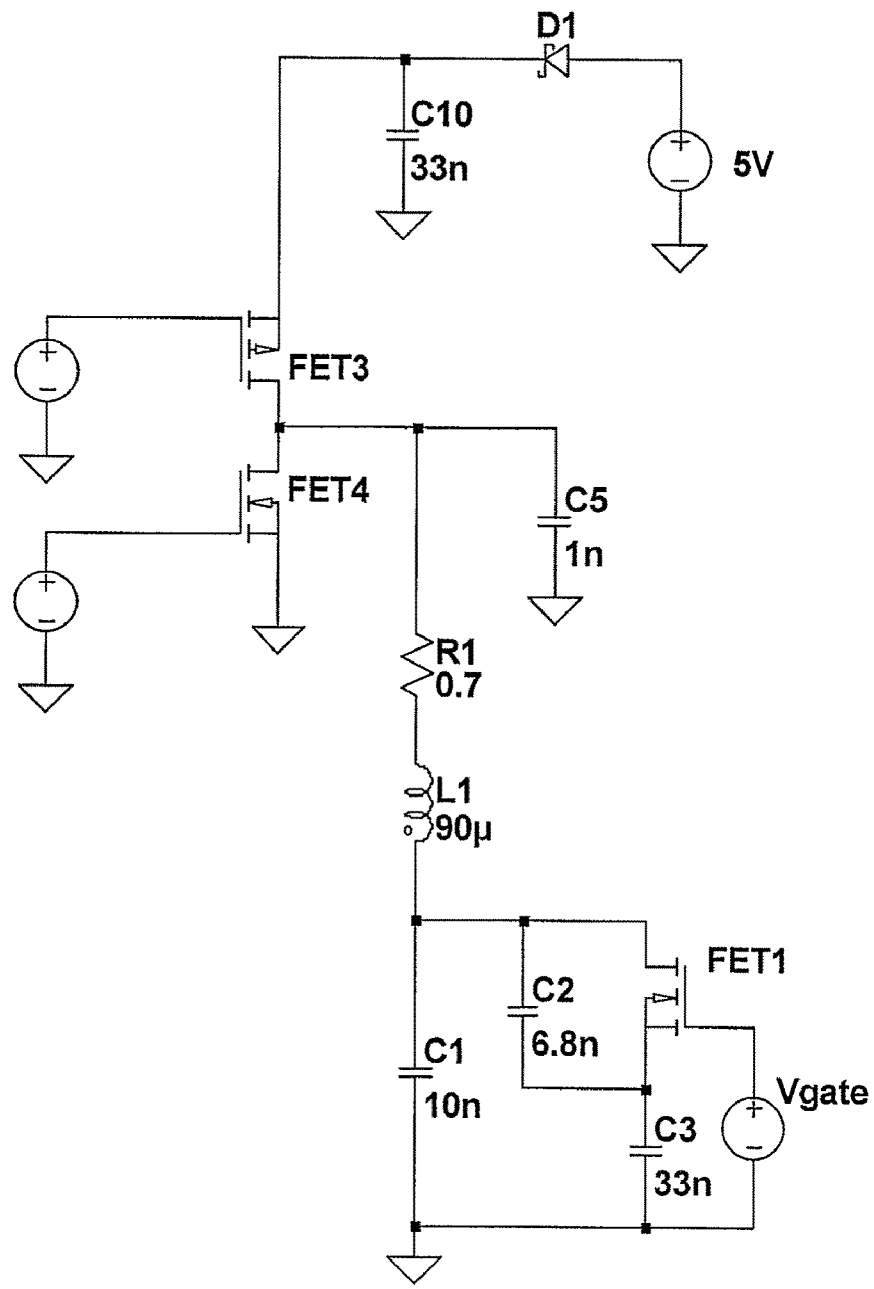
FIG. 1 is a schematic of an interrogator incorporating a self-adaptive resonator, negative feedback, and a high Q antenna.

FIG. 1 shows an embodiment of an RFID interrogator incorporating a nonlinear resonator. The resonator comprises an antenna with inductance 90 mH and series resistance of 0.7 Ω, giving a Q at 125 kHz of approximately 100. The antenna is connected to a capacitive network C1, C2, C3 and MOSFET FET1. The capacitive network has two distinct states with the FET1 on and FET1 off. When FET1 is on the total capacitance is 43 nF, since C2 is shorted out, whereas when FET1 is off the total capacitance is 15.6 nF. FET1 is turned on or off depending on the amplitude of the waveform at the source potential, relative to the fixed gate voltage V gate. The duty cycle of the FET1 on state varies with the resonance amplitude, which naturally adjusts to allow the resonator to match the 125 kHz stimulus frequency. The amplitude of the resonator is controlled through V gate, increasing as this voltage is reduced to negative voltages.

The stimulus to the resonator is supplied through the complementary MOSFET pair, FET3 and FET4, which are controlled through two voltage sources. The stimulus pulse is approximately 2.5 μs in duration, also with a deadband delay between the two voltage sources to prevent shoot through current.

The resonance energy supply is provided by the 5V voltage source that is connected to the positive stimulus pulse through shottkey diode D1. C10 provides a path for transient current before the required energy to maintain the resonance is drawn through D1. The combination of energy supply through D1 and C10 also provides feedback that reduces transient changes in the resonator amplitude in response to load modulations from a tag. This property has been shown to increase the speed of response of an RFID reader to load modulations, whilst still maintaining low loss for steady state powering signals. One alternative to this implementation of feedback is PWM feedback from the resonance amplitude to the width of the stimulus pulse supplied through FET3 and FET4.

Figure 2:
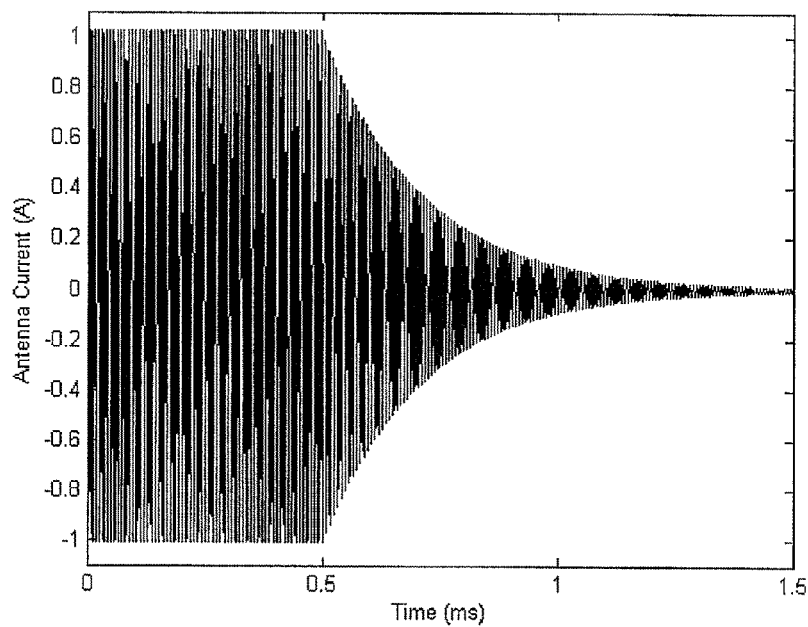
FIG. 2 is a waveform showing the free decay of the antenna current.

FIG. 2 shows the antenna current as a function of time when the stimulus pulses are turned off at approximately 0.5 ms. The resonator is initially oscillating with amplitude of approximately 1 A. When the stimulus is turned off then this follows an exponential decay over the next 1 ms. The low loss of the resonant system translates as a long decay time that does not allow for fast communication from the interrogator to the tag.

Figure 3:
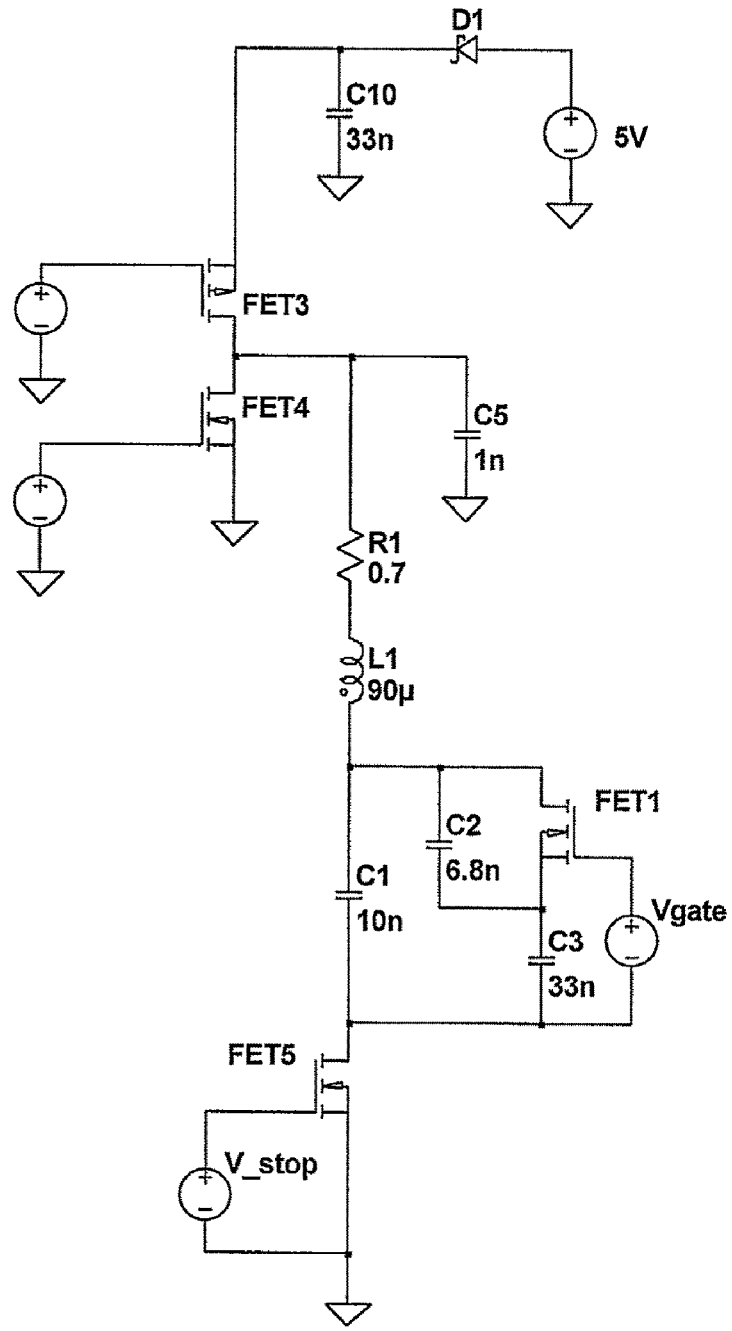
FIG. 3 is a schematic of an interrogator with a MOSFET to cut off the current in the antenna.

An alternative to the free decay is to stop the energy in the resonator with a switch such as a MOSFET. FIG. 3 shows such an arrangement where a low loss MOSFET FET5 is introduced in series with the resonance current. This is controlled by a voltage source V_stop. FIG. 4 shows waveforms that illustrate the behaviour when the resonance current is turned off.

Figure 4A:
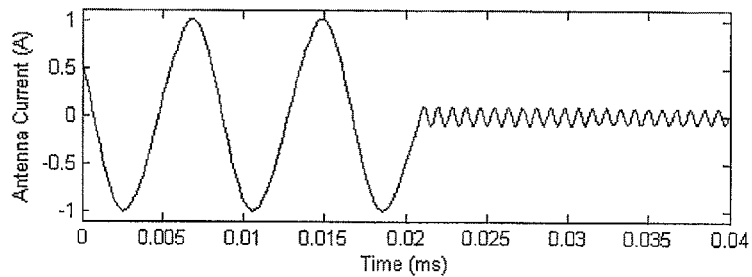
FIG. 4A is a graph of the antenna current when it is cut off.
Figure 4B:
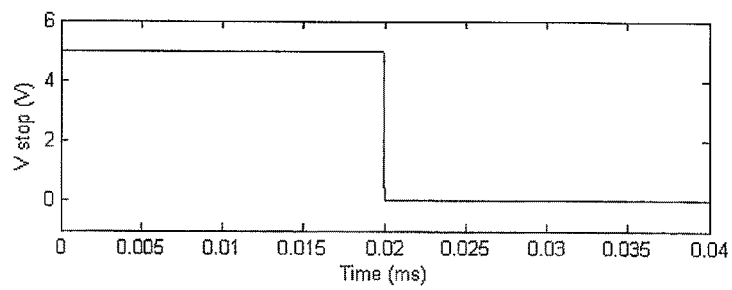
FIG. 4B is a graph of the control voltage to the cut-off MOSFET.

FIG. 4A shows the resonance current as a function of time and FIG. 4B the control voltage V_stop. FET5 is turned off during the negative portion of the antenna current, which completes its full cycle through the body diode of this MOSFET. At this point the stimulus pulses to the resonator are also halted. When the negative polarity current is complete then the MOSFET blocks the path of the resonance current, which then drops to low levels. The subsequent high frequency oscillation of the antenna current at lower amplitude is the result of the antenna resonating with a much lower capacitance corresponding to the drain capacitance of FET5 when turned off.

Figure 4C:
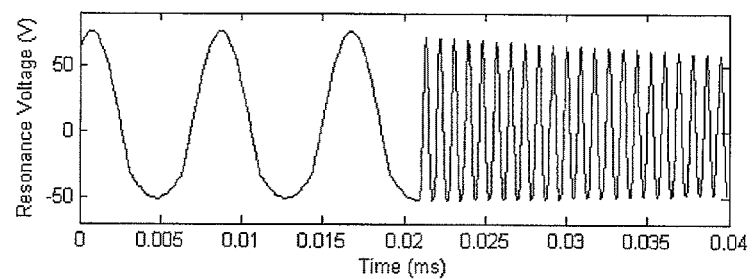
FIG. 4C is the corresponding graph of the resonance voltage.

FIG. 4C shows the corresponding graph of the resonance voltage as a function of time. Although the current drops to low levels after the MOSFET transition, the resonance voltage does not. The higher frequency of the remaining current manifests itself as a resonance voltage similar in magnitude to the earlier oscillation of the resonance.

The behaviour illustrated in FIG. 4 does lead to an output field, dependent on the antenna current, that is useful for reader to tag communication. The amplitude of the field at the tag resonant frequency drops sharply at the end of one cycle, rather than the slow free decay shown in FIG. 2. However the subsequent high frequency oscillation is likely to cause problems with the generation of interference and EMC compliance failure.

Figure 5:
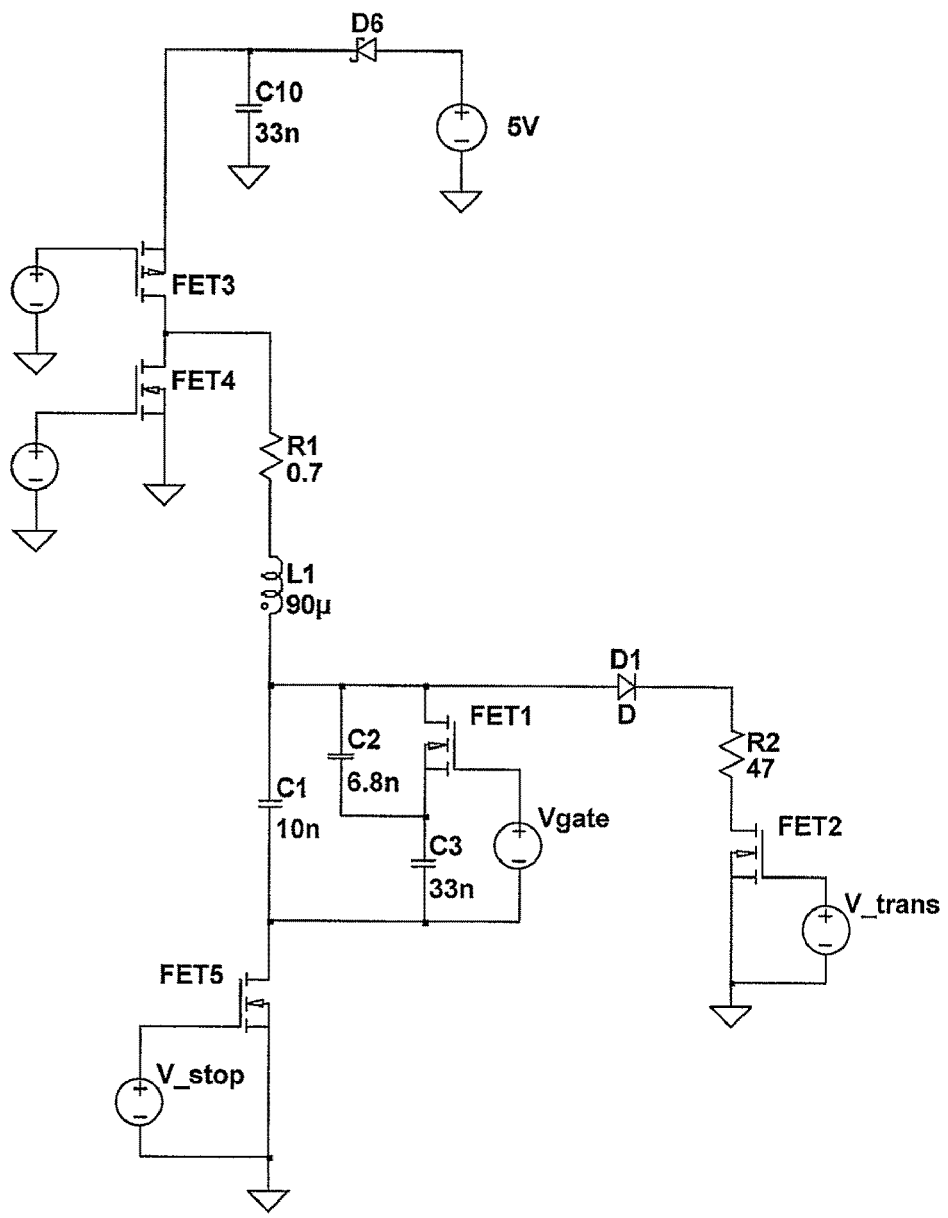
FIG. 5 is a schematic of an interrogator with an added block to dissipate the energy of the turn-off transient.

FIG. 5 shows an embodiment, similar to FIG. 3 but with an additional block that controls the oscillation of the resonator after the current is switched off by FET5. The new block comprises a diode D1, resistor R2, and MOSFET FET2. When the resonator is oscillating then FET2 is turned off by the control voltage V_trans. This prevents forward conduction through FET2 and the diode D1 prevents conduction in the opposite direction through the body diode of FET2; the block is effectively isolated from the resonator. When FET5 is turned off to stop the resonator current, then FET2 is turned on for a duration of 8 μs. When the negative portion of the antenna current completes and the resonator current is blocked then the resonance voltage jumps to positive values. However now that FET2 is on, this results in conduction through D1, R2 and FET2. The energy in the high frequency oscillation shown in FIG. 4 is dissipated in R2 and the resonance stops cleanly.

Figure 6A:
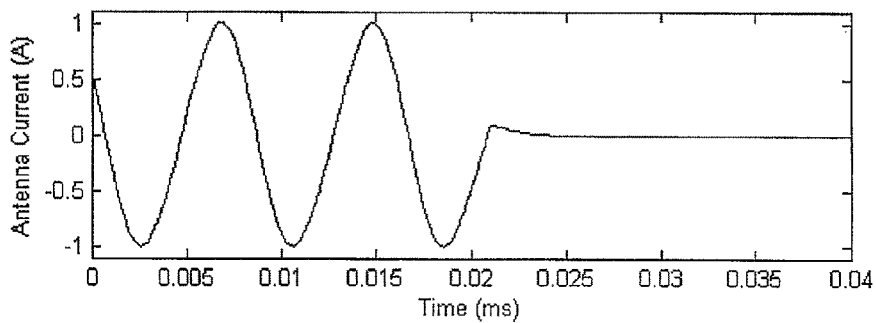
FIG. 6A is a waveform of the circuit in FIG. 5 when the antenna current is cut off and the turn-off transient controlled.
Figure 6B:
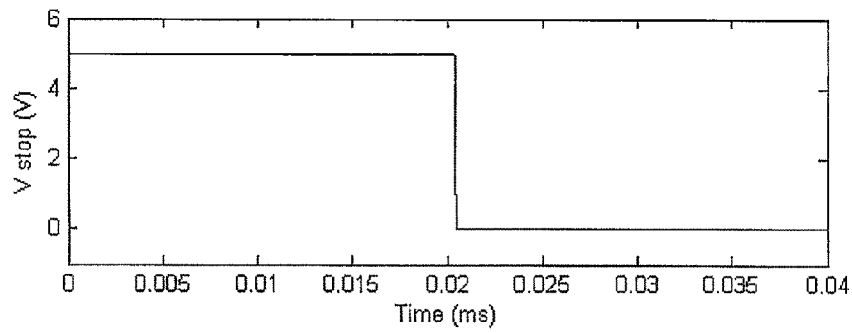
FIG. 6B is the control voltage to the turn-off MOSFET.
Figure 6C:
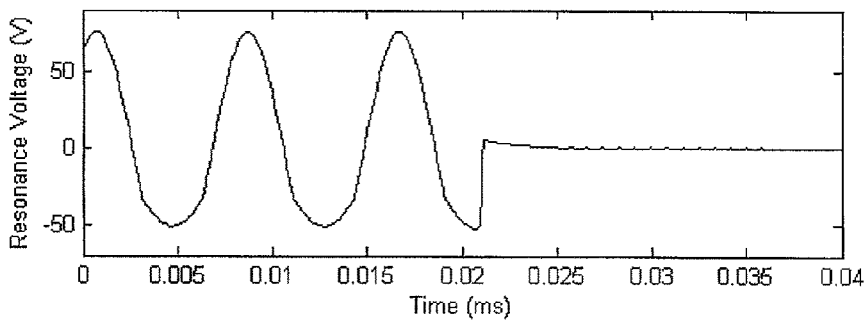
FIG. 6C is the corresponding graph of the resonance voltage.
Figure 7A:
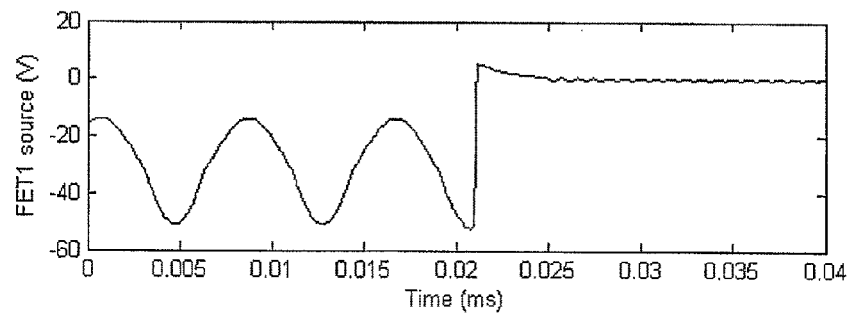
FIG. 7A shows the source voltage of the resonance MOSFET, FIG. 7B the drain voltage of the cut-off MOSFET.
Figure 7B:
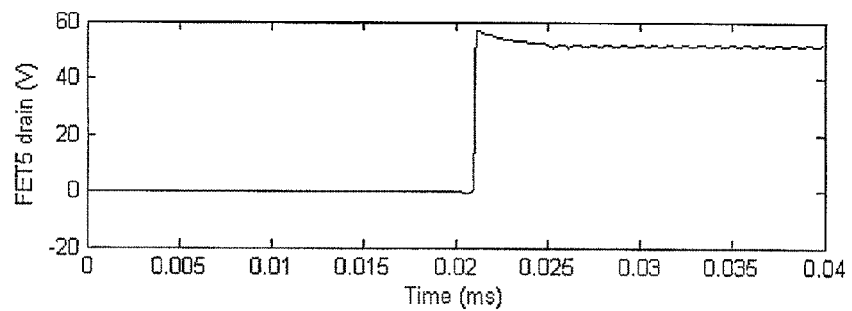
FIG. 7 shows additional waveforms of the circuit in FIG. 5.
FIG. 7C shows the control voltage to the MOSFET used for control of the turn-off transient.
Figure 7C:
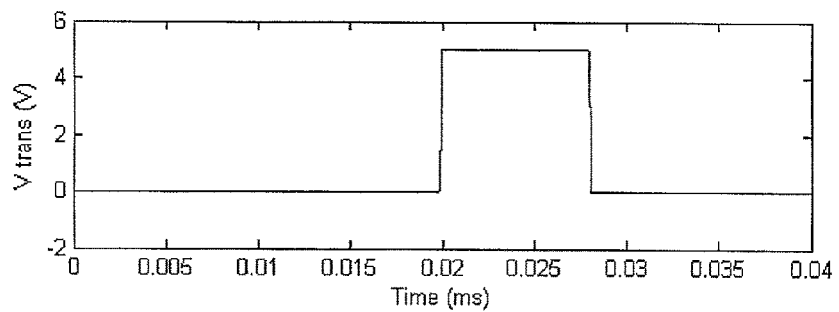

FIG. 6 shows this behaviour with similar graphs to those shown in FIG. 4. Now the high frequency oscillation in the antenna current and resonance voltage is absent and the modulation of the interrogator field has near-ideal turn off characteristics. Additional graphs are shown in FIG. 7 that show the final state of the resonator. FIG. 7 shows the voltage at the FET1 source, which jumps from negative values to approximately 0V once the antenna current is stopped. The corresponding voltage at FET5 drain shows a jump from 0V to approximately 50V. FIG. 7C shows the control voltage V_trans, which turns on FET2 for 8 ms.

The resonator current is close to zero when it is turned off, and nearly all the resonance energy is stored as charge in the capacitors. This charge is responsible for the voltage that results at the FET5 drain and is still available as energy available to restart the resonator when required. Graphs that illustrate the behaviour of the resonator when it is re-started are shown in FIG. 8.

Figure 8A:
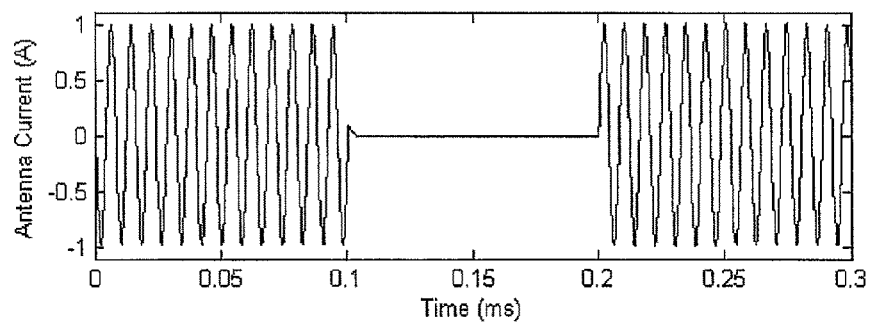
FIG. 8A shows the antenna current.
Figure 8B:
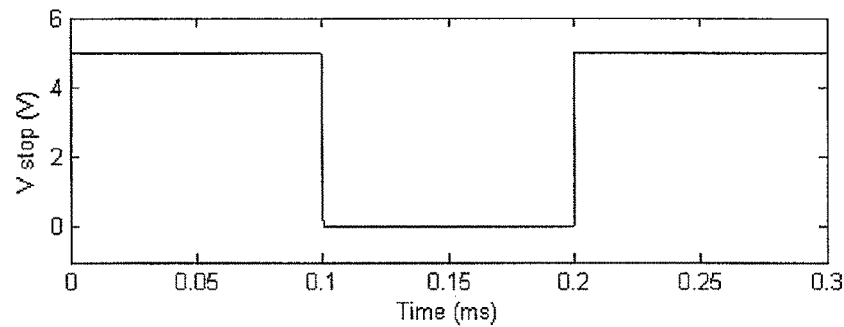
FIG. 8B shows the control voltage to the turn-off MOSFET.
Figure 8C:
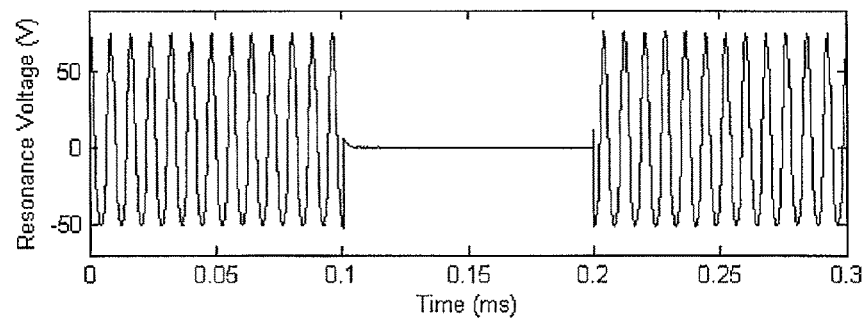
FIG. 8C shows the resonance voltage.

FIG. 8A shows the antenna current at a function of time when the resonator is stopped at approximately 0.1 ms and turned on again at 0.2 ms. FIG. 8B shows the corresponding voltage waveform of V_stop and FIG. 8C shows the resonance voltage. When the resonator is turned back on, V_stop jumps to 5V, turning on FET5 and allowing the resonance current to flow. At this point the stimulus pulses are also turned back on allowing the resonator to maintain its amplitude when re-started. The timing of the stimulus pulses and the turn on of the antenna current with V_stop may be adjusted to smooth the re-start behaviour. In this example the turn on takes place 100 μs after turn off and this results in the stimulus pulses at a similar point in the resonance cycle right from turn on. If these are mismatched then there will be some transients in the amplitude at turn on, however these are minimised through the feedback present in the interrogator design. The use of feedback is not critical for a smooth turn on however it does increase the tolerance in the accuracy of the turn on time that results in acceptable behaviour. The interrogator may measure the behaviour in normal oscillation to determine the timing of the stimulus pulses relative to the resonance current. It may then use this to calculate a turn on time that will result in a smooth waveform. Alternatively the interrogator may turn on with a default timing and the feedback may reduce the transient changes in the resonator amplitude. In summary, this embodiment shows how a high Q resonator may be used in an RFID interrogator for fast reader to tag communications. The interrogator current may be turned off quickly, with the energy of the resonator stored as charge on the system capacitors. In the process unwanted signals may be generated as a result of the sharp turn off and a method for control of such signals has been described. When the resonator is re-started the stored energy may be released and the resonator started in a high amplitude state without a gradual ramp up. As a result the interrogator may have excellent turn off and turn on modulation characteristics allowing high speed reader to tag communications. The re-use of the resonance energy gives the interrogator high efficiency operation not only when used as a reader, but also for reader to tag communications.

The resonator used in the embodiments described is a nonlinear resonator that matches to the stimulus over a range of frequencies. Such a resonator may have advantages in high Q RFID systems, however there is no intended limitation to this class of resonator. In fact a conventional linear resonator may be employed in the same manner. The linear resonator may be stopped sharply with the energy stored for subsequent re-use and control of any transient oscillations generated. The linear resonator may also include feedback to minimise transients in the amplitude of the resonance, which may also speed up the response of the reader to load modulations in a tag.

The 125 kHz frequency band chosen for the embodiments is purely by way of example. Applications of the invention are not limited to frequencies around this band, and extend to include all frequencies ranging from sub-sonic to microwave frequencies and beyond. More specifically to RFID, all common RFID frequency bands are included, such as 125 kHz, 134 kHz, 13.56 MHz, 869 MHz, 915 MHz, and the like.

The modulation method may be used in an RFID interrogator for all reader to tag communications including tag programming and communication for encryption. It may also be employed for half duplex reading of a tag. In fact any communication that requires high speed and low loss may benefit from the methods disclosed within.

No doubt many other effective alternatives will occur to the skilled person. It will be understood that the invention is not limited to the described embodiments and encompasses modifications apparent to those skilled in the art lying within the spirit and scope of the claims appended hereto.

I claim:

1. A RFID tag interrogator comprising a transmitter, the transmitter comprising:
   a resonant circuit; and
   a driver coupled to drive said resonant circuit, wherein said resonant circuit includes a resonance regeneration system such that during amplitude modulation of a resonant signal in said resonant circuit, (a) when an amplitude of said resonant signal is reduced, energy from said reduction is stored, and (b) when said amplitude is increased, said stored energy is used to regenerate said resonant signal.

2. The RFID tag interrogator as claimed in claim 1 wherein said resonance regeneration system comprises a switch in series with said at least one capacitor, and an oscillator synchronised to said resonant signal to control said switch.

3. The RFID tag interrogator as claimed in claim 1 further comprising a transient control system to dissipate energy not stored by said resonance regeneration system.

4. The RFID tag interrogator as claimed in claim 3 wherein said transient control system comprises a transient control switch coupled to an energy dissipating device, and an oscillator synchronised to said resonant signal to control said transient control switch.

5. The RFID tag interrogator as claimed in claim 4, wherein said resonance regeneration system comprises a resonance regeneration switch in series with said at least one capacitor, and an oscillator synchronised to said resonant signal to control said resonance regeneration switch, wherein said resonance regeneration switch and said transient control switch are controlled in synchronism such that when said resonance regeneration system is acting to store energy, said transient control system is acting to dissipate energy,. and when said resonance regeneration system is acting to regenerate said resonant signaL said transient control system is not substantially dissipating energy.

6. The RFID tag interrogator as claimed in claim 5 wherein resonance regeneration switch and transient control switch each comprise an FET.

7. The RFID tag interrogator as claimed in claim 1 wherein said driver comprises a push-pull driver.

8. The RFID tag interrogator as claimed in claim 1 further comprising a feedback circuit to compensate for transient changes in amplitude of said resonant signal.

9. The RFID tag interrogator as claimed in claim 8 wherein said feedback circuit comprises a PWM (pulse width modulating) circuit or a passive feedback circuit.

10. The RFID tag interrogator as claimed in claim 1 wherein said resonant circuit comprises a non-linear resonant circuit.

11. The RFID tag interrogator as claimed in claim 10 wherein said resonant circuit comprises an inductor coupled to a first capacitor and further comprising (i) a controllable element, (ii) a second capacitor coupled with said first capacitor by said controllable element, and (iii) a control device to control said controllable element, such that a total effective capacitance of said first and second capacitor varies over a duty cycle of an oscillatory signal in said resonant circuit.

12. The RFID tag interrogator as claimed in claim 10 wherein said controllable element comprises a transistor and wherein said control device comprises a bias circuit for said transistor.

* * * * *